US006661293B2

(12) United States Patent
Paananen

(10) Patent No.: US 6,661,293 B2
(45) Date of Patent: Dec. 9, 2003

(54) METHOD AND ARRANGEMENT FOR SETTING A FREQUENCY

(75) Inventor: Heikki Paananen, Palokka (FI)

(73) Assignee: Nokia Mobile Phones, Ltd., Espoo (FI)

( * ) Notice: Subject to any disclaimer, the term of this patent is extended or adjusted under 35 U.S.C. 154(b) by 24 days.

(21) Appl. No.: 09/894,185

(22) Filed: Jun. 28, 2001

(65) Prior Publication Data

US 2002/0000884 A1 Jan. 3, 2002

(30) Foreign Application Priority Data

Jun. 30, 2000 (FI) .............................................. 20001557

(51) Int. Cl.$^7$ ................................................. H03L 7/10
(52) U.S. Cl. .............................. 331/10; 331/2; 327/147; 327/148; 327/156
(58) Field of Search ................................. 327/147, 148, 327/156, 157, 149; 331/10, 11, 2, 18

(56) References Cited

U.S. PATENT DOCUMENTS

| | | | | |
|---|---|---|---|---|
| 5,838,202 A | | 11/1998 | Kosiec et al. ................ | 331/1 A |
| 5,933,058 A | * | 8/1999 | Pinto et al. .................... | 331/17 |
| 6,066,988 A | | 5/2000 | Igura ........................... | 331/18 |
| 6,236,275 B1 | * | 5/2001 | Dent ............................. | 331/1 A |
| 6,420,917 B1 | * | 7/2002 | Klemmer ...................... | 327/156 |
| 6,466,069 B1 | * | 10/2002 | Rozenblit et al. ........... | 327/157 |

FOREIGN PATENT DOCUMENTS

| | | |
|---|---|---|
| EP | 0755120 A1 | 1/1997 |
| EP | 1030453 A1 | 8/2000 |
| EP | 1039640 A1 | 9/2000 |

OTHER PUBLICATIONS

Sidney Soclof, "Applications of Analog Integrated Circuits", Prentice-Hall, 1985.*
"Fast Settling PLL Frequency Synthesizer Utilizing The Frequency Detector Method Speedup Circuit", Y. Sumi, IEEE Transactions on Consumer Electronics, vol. 43, No. 3, 1997.

* cited by examiner

Primary Examiner—Tuan T. Lam
Assistant Examiner—Hiep Nguyen
(74) Attorney, Agent, or Firm—Perman & Green, LLP

(57) ABSTRACT

The invention relates to the locking of a phase-locked loop when the frequency setting (an) of the loop is changed. The locking speed of the loop is improved at the expense of noise characteristics so that these are momentarily degraded. When changing the frequency, the difference between the new frequency set for the VCO (430) and the actual frequency ($f_{VCO}$) is measured and the VCO is immediately controlled according to this difference. To that end, counters (441, 444) dividing a reference frequency ($f_{ref}$) and the VCO frequency are made to simultaneously start counting from zero. Thus the length of the pulse issued by a phase difference detector (410) corresponds to the said frequency difference. After the setting of the new frequency value the loop filter (420) is turned into a purely capacitive circuit the output voltage ($v_c$) of which changes proportionally to the length of the pulse from the phase difference detector. The loop parameters are arranged such that the resulting voltage difference causes a change in the VCO frequency such that the magnitude of that change is immediately correct. The loop according to the invention locks onto the new frequency faster than in the prior art. Moreover, the number of additional circuits required by the invention is relatively small.

12 Claims, 4 Drawing Sheets

METHOD AND ARRANGEMENT FOR SETTING A FREQUENCY

The invention relates to a method for bringing a phase-locked loop into lock when the frequency setting of the loop changes. The invention further relates to an arrangement for bringing a phase-locked loop into lock.

The phase-locked loop or PLL is a circuit in which feedback is used to, first, force the frequency of the oscillator in the circuit to follow the frequency of the input signal and, second, make the phase difference between the two waveforms in question constant. If the input signal is continuously varying, the PLL can be arranged to "seize" a certain frequency component. In telecommunications technology, the PLL is widely used for various synchronization purposes and frequency synthesis, for example. The latter is used in multichannel radio devices, such as mobile stations, to set the carrier frequency when selecting a channel.

Figure 1:
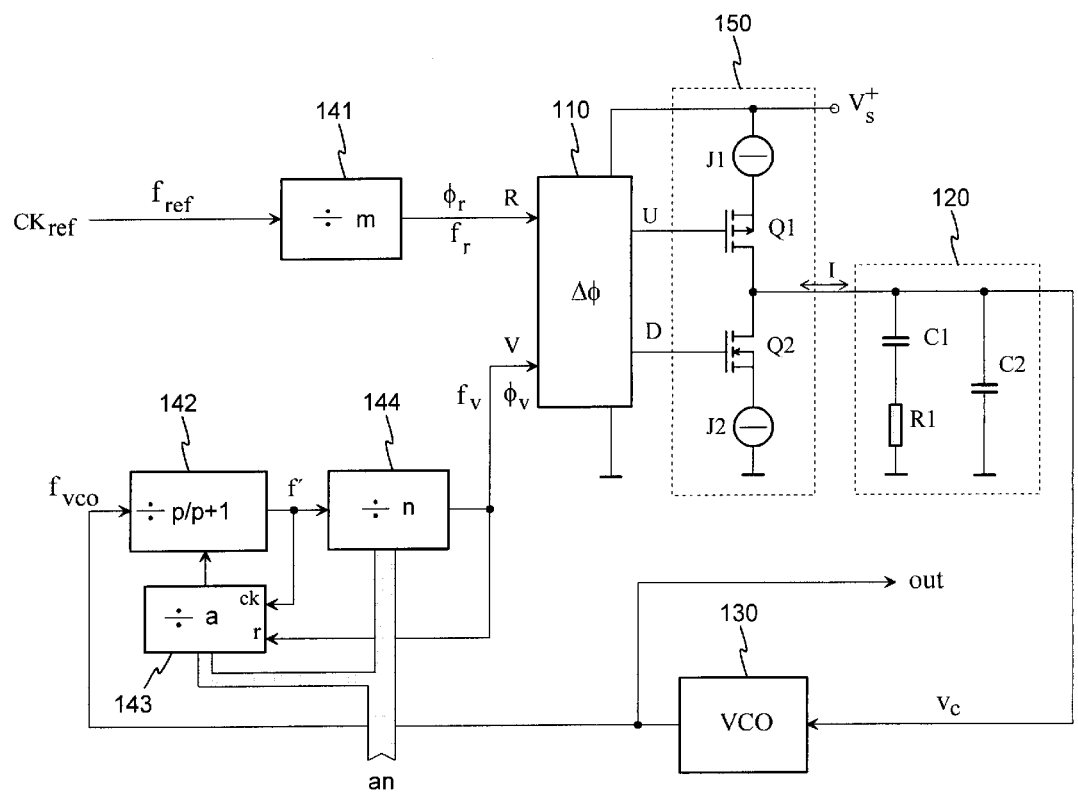

There are very many known circuit implementations of the PLL. FIG. 1 shows an example of known circuit used for frequency synthesis. It includes the basic parts of the PLL, namely a phase difference detector 110, filter 120 and a voltage-controlled oscillator (VCO) 130. Connected to the first input R of the phase difference detector is a reference divider 141 to which a reference clock $CK_{ref}$ is brought from an external oscillator, the frequency $f_{ref}$ of the reference clock keeping constant with great accuracy. Hereinafter the reference divider will be called the r-divider for short. The division factor of the r-divider is m, which corresponds to an output frequency of $f_r$. The loop is produced by the phase difference detector controlling the charge pump 150, the charge pump controlling the filter 120 and the filter controlling the VCO. Further, the output signal of the VCO is taken to a prescaler 142, the output signal of the prescaler is taken to a second divider 144, and the output signal of the latter is taken to the second input V of the phase difference detector. Hereinafter the said second divider will be called the v-divider for short. The frequency of the VCO is $f_{VCO}$, the output frequency of the prescaler is f' and the output frequency of the v-divider is $f_v$. In connection with the prescaler 142 and v-divider 144 there is an auxiliary divider 143 the clock input of which is connected to the prescaler output. The division ratio of the v-divider is n, and the division ratio of the auxiliary divider is a. These three counters are interconnected in a known manner such that during the v-divider cycle the prescaler divides its input frequency by a number p for a clock cycle amount n−a of the auxiliary divider. During the rest of the v-divider cycle, i.e. for the duration of a clock cycle amount a of the auxiliary divider, the prescaler divides the frequency by a number p+1. Thus the number of VCO cycles during the v-divider cycle is p(n−a)+(p+1)a.

Considering that the input frequencies $f_r$ and $f_v$ of the phase difference detector are forced equal, we get $f_{VCO}=(pn+a)f_r=f_0+af_r$.

In the latter expression, $f_0=pnf_r$. By selecting suitable parameter values m, n, p and a, we get a desired lower limit $f_0$ and a minimum frequency step $f_r$ of a desired magnitude for the VCO frequency. Numbers a and n can be loaded by the software in the counters in question and can be used to change the frequency when necessary.

The phase difference detector 110 has got two outputs U and D. When the phase of the first input R leads the second input V, there appear "0" pulses at the frequency of $f_r$ at the output U, the length of the said pulses being proportional to the phase difference between the input signals. Output D remains in state "0". When the phase of the first input R lags behind the second input V, there appear "1" pulses at the frequency of $f_r$ at the output D, the length of the said pulses being proportional to the phase difference between the input signals. Output U remains in state "1". Output U controls the upper switch component Q1 in the charge pump 150 in such a manner that the Q1 passes during a U pulse the current of the current source J1, connected in series with the switch Q1, from the positive terminal of the operating voltage supply to the filter 120. Output D controls the lower switch component Q2 in the charge pump 150 in such a manner that the Q2 passes during a D pulse the current of the current source J2, connected in series with the switch Q2, from the filter 120 to ground. In the example of FIG. 1 the filter 120 includes a series connection of a capacitor C1 and resistor R1 as well as a capacitor C2 in parallel with the said series connection. Filter component values are chosen such that the filter impedance at frequency $f_r$ is determined only by resistance R1. At lower frequencies, capacitance C1 raises the magnitude of the filter impedance, and at higher frequencies, capacitance C2 lowers the magnitude of the filter impedance. The effect of the capacitances may also be expressed by saying that they smooth out the shape of the voltage coming from the charge pump. When the PLL is in operation, the filter voltage $v_c$ has a certain positive level. The said U pulses raise this voltage level and the said D pulses lower it. The oscillator 130 is controlled by the voltage $v_c$. The increase in the control voltage results in an increase in the frequency $f_{VCO}$ and vice versa.

A disadvantage of circuits like those described above is that the locking of the loop may take too long a time when the frequency is changed. A high locking speed is required e.g. when transmitting data in several time slots belonging to different frequency division channels, whereby changes between channels are sometimes relatively rapid. An insufficient speed in the loop may be caused by the slowness of the filter in the circuit. However, making the filter faster would degrade the noise characteristics of the loop. On the other hand, the insufficient speed of the loop may be caused by too low input frequency in the phase difference detector. As known, frequency correction advances in steps: Each individual subcorrection is based on a comparison carried out during one cycle of the input frequency $f_r$.

The settling speed of the VCO frequency can in a known manner be increased using a so-called fractional-N structure. In such a structure the output frequency of the VCO can be changed in steps that are only a certain fraction of the reference input frequency of the phase difference detector. The reference input frequency may then be greater compared to a corresponding structure according to FIG. 1, which means a higher settling speed. A disadvantage of the fractional-N circuit is its complicity, resulting in a relatively large size and high manufacturing cost.

Figure 2:
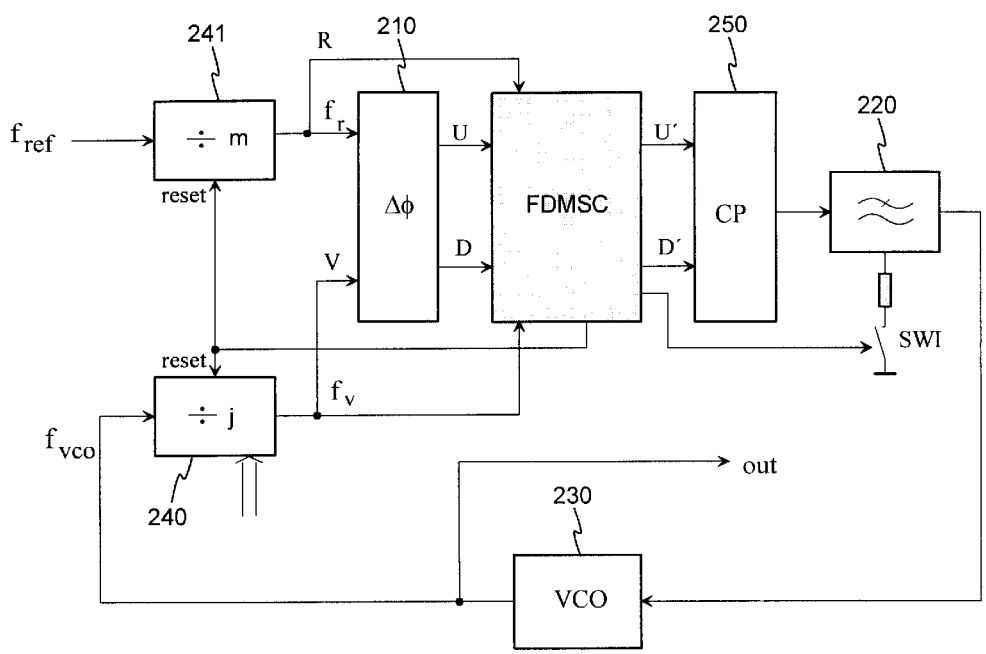

In the article "Fast Settling PLL Frequency Synthesizer Utilizing the Frequency Detector Method Speedup Circuit", published in the IEEE Transactions on Consumer Electronics, Vol. 43 No 3 August 1997, there is presented a circuit for increasing the settling speed of the loop. FIG. 2 shows the block diagram of the structure. It is based on a structure like the one shown in FIG. 1, comprising an r-divider 241, phase difference detector 210, charge pump 250, low-pass filter 220, voltage-controlled oscillator 230 and a divider unit 240. The latter corresponds to the dividers 142, 143 and 144 in FIG. 1. To speed up the settling of the frequency the circuit further includes a block called 'frequency detector method speedup circuit', FDMSC for short, and a switch SWI for the low-pass filter. The input signals of the FDMSC are the same output signals R and V of the r-divider and divider unit 240 that are also taken to the phase difference detector, and the output signals U and D of the phase difference detector. The output signals of the FDMSC are the control signals U' and D' of the charge pump 250, the reset signal of the r-divider and divider unit 240, and the control signal for the switch SWI. When the loop is in lock, the FDMSC has no effect on its operation; the charge pump control signal U'=U, and D'=D. When the frequency setting changes in the divider unit 240, the FDMSC observes a difference between the frequencies $f_r$ and $f_v$ of signals R and V and connects to the charge pump a constant control signal U' or D', depending on the direction in which the VCO frequency has to be changed. So at this stage the output signals U and D of the phase difference detector 210 have no effect on the operation of the loop. In addition, the FDMSC closes the switch SWI. This switching substantially decreases the time constant of the low-pass filter 220, increasing the speed of change of the filter output voltage. When the frequency $f_v$ again has reached the frequency $f_r$, the FDMSC opens the switch SWI, returns the charge pump control to the normal state, and resets the r-divider 241 and divider unit 240. After that, the phase difference detector again indicates a phase difference between the signals R and V, and the loop locks.

In accordance with the operation described above the reduction of the duration of the frequency change phase in the circuit of FIG. 2 is based on using continuous control for the charge pump in the change phase instead of pulse control and, on the other hand, speeding up the loop filter. A disadvantage of the circuit is that the FDMSC means a relatively large addition in the loop logic.

An object of the invention is to reduce the said disadvantages associated with the prior art. The method according to the invention is characterized by that which is specified in the independent claim 1. The structure according to the invention is characterized by that which is specified in the independent claim 6. Some advantageous embodiments of the invention are specified in the other claims.

The basic idea of the invention is that the locking speed of the loop is improved at the expense of noise characteristics. The degradation of noise characteristics is momentary only, so it is of no importance when using the frequency produced by the structure. When the frequency is changed, the difference between the new frequency set for the VCO and the actual VCO frequency is measured, and the VCO is immediately controlled in accordance with the difference measured. This is accomplished as follows: The counters dividing the reference frequency and VCO frequency are made to count simultaneously from zero. Then the length of the first output pulse of the phase difference detector corresponds to the difference between the new frequency and the old frequency. After setting the new frequency value the loop filter is switched so as to become a purely capacitive circuit the output voltage of which changes in proportion to the length of the pulse from the phase difference detector. The loop parameters are selected such that the voltage difference produced during the said pulse produces directly in the VCO frequency a change of the correct magnitude. The frequency correction cycle described above may be repeated a couple of times, just to be on the safe side.

An advantage of the invention is that the loop locks onto the new frequency more quickly than in the prior art. Another advantage of the invention is that its implementation is relatively simple, i.e. it requires relatively few additional circuits.

Figure 4:
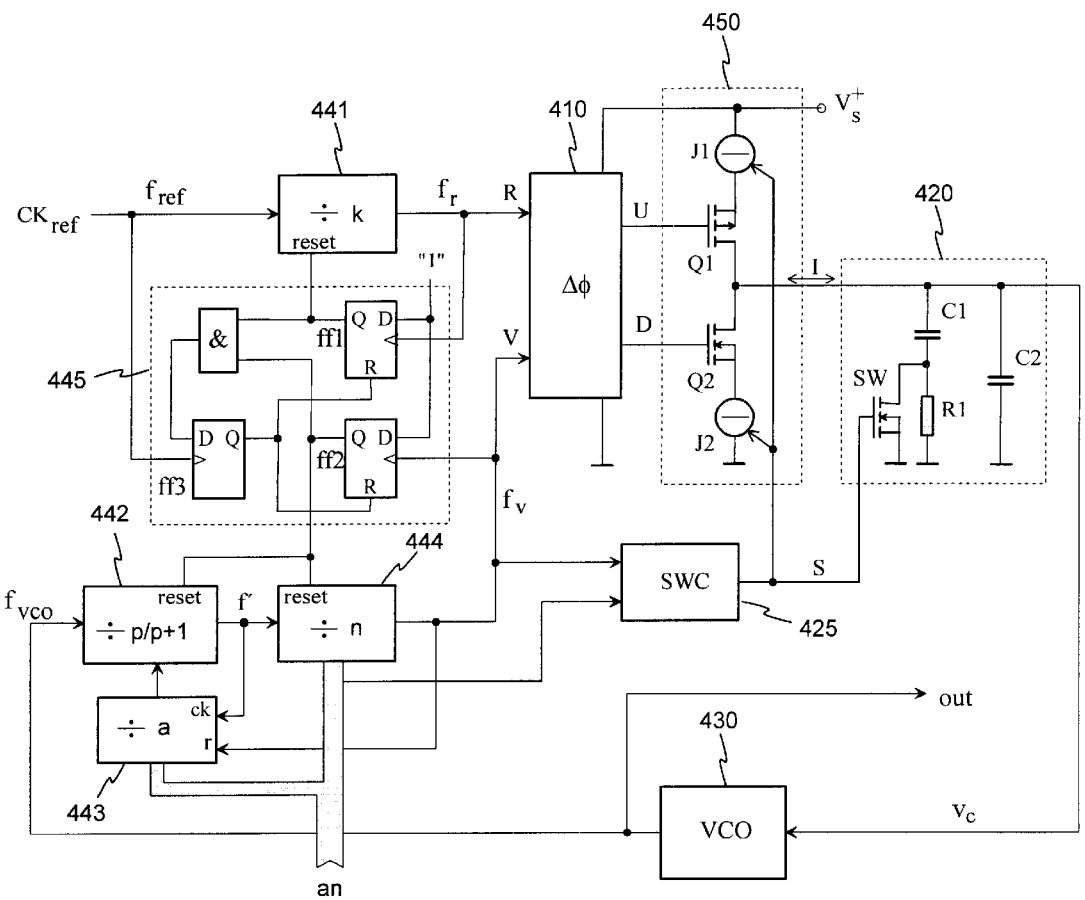
Figure 5:
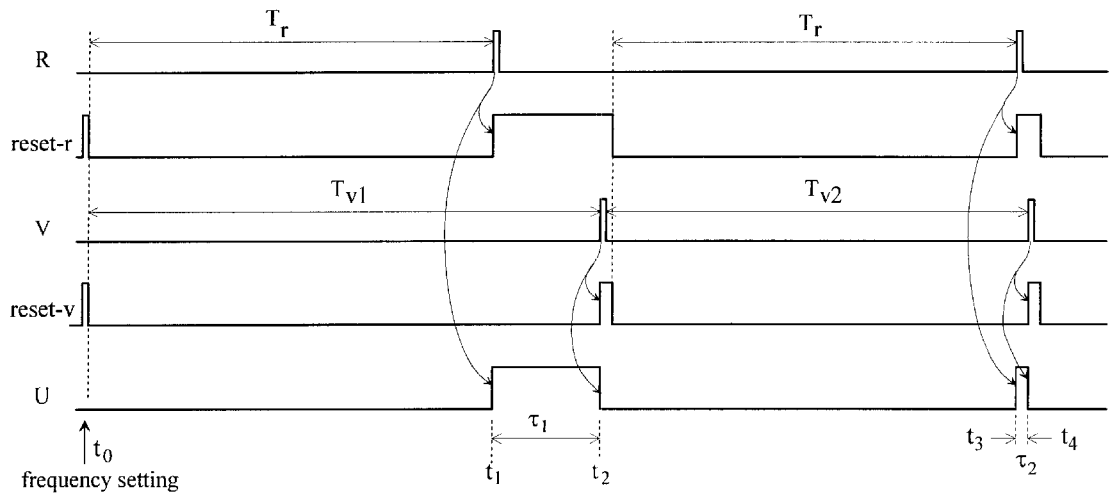
Figure 6:
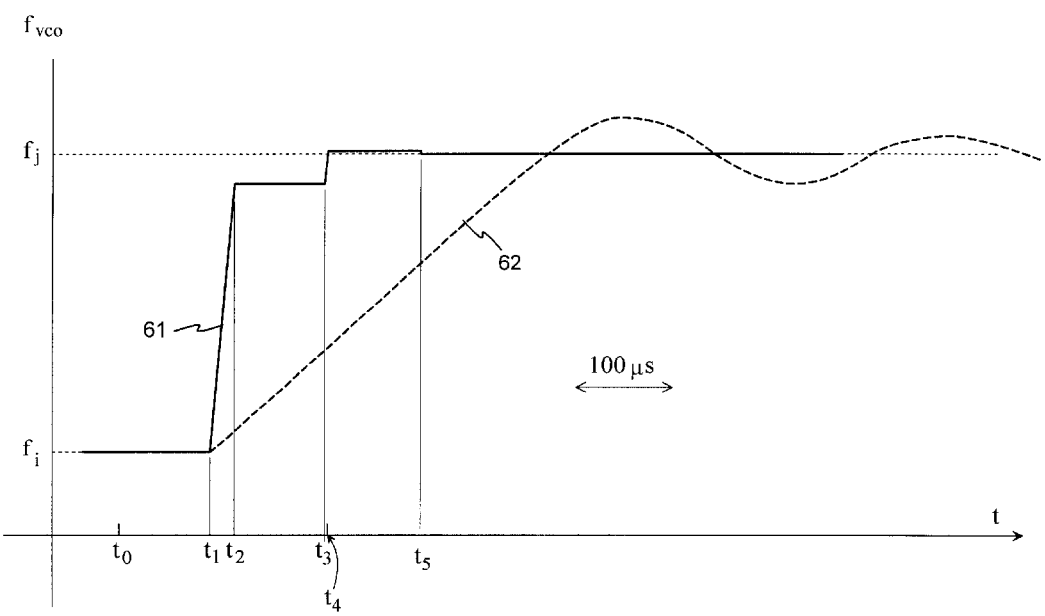

The invention is described in more detail in the following. Reference is made in the description to the accompanying drawings wherein FIG. 1 shows an example of the frequency synthesizer according to the prior art, FIG. 2 shows another example of the frequency synthesizer according to the prior art, FIGS. 3a,b illustrate in the form of flow diagram the method according to the invention, FIG. 4 shows an example of the circuit according to the invention, FIG. 5 illustrates in the form of pulse diagram an example of the operation of the circuit according to the invention, and FIG. 6 shows a comparison between the locking of a loop according to the prior art and the locking of the loop according to the invention.

FIGS. 1 and 2 were already discussed in conjunction with the description of the prior art.

Figure 3A:
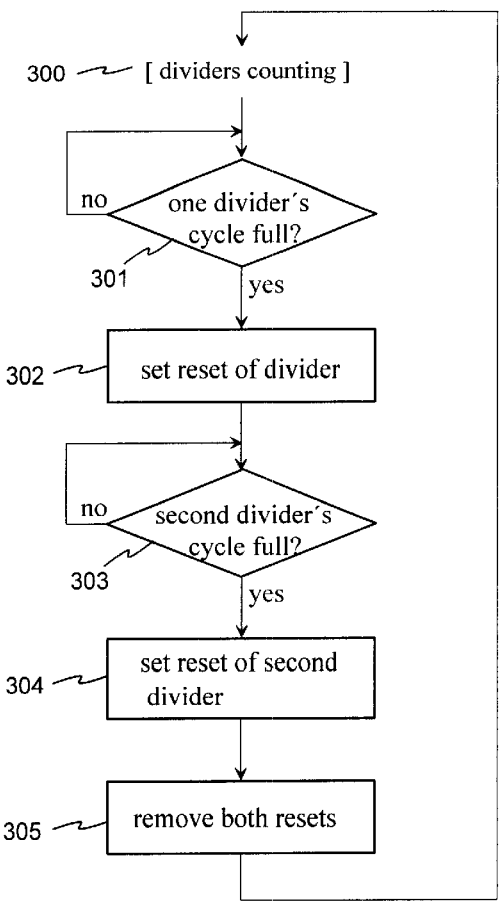

FIG. 3a shows a flow diagram on the control of divider counter according to the invention. The method can be applied e.g. to the r-divider 141 and prescaler 142, v-divider 144 and auxiliary divider 143 shown in FIG. 1. Let the divider formed by the latter three together be called the vco-divider. At step 300 in FIG. 3 the dividers are counting their clock pulses. During the counting it is monitored in accordance with step 301 whether the r-divider or vco-divider cycle is completed. When either of these two cycles is completed, the reset of the divider in question is set in accordance with step 302. In step 303 the cycle of the other of the said dividers is awaited to be completed. When this happens, the reset of that other divider is also set in accordance with step 304. Then, immediately, in step 305, both resets are removed, synchronized with the reference clock $CK_{ref}$, for example. After that, both the r-divider and vco-divider start counting simultaneously from zero up. The phase difference detector outputs a pulse which starts upon the completion of the cycle of the first divider and lasts up to the completion of the cycle of the second divider. As the dividers start their counting always simultaneously, as described above, the output pulse of the phase difference detector produces separately at every cycle the information on the frequency difference between the input frequencies. This information can be used for speeding up the settling of the VCO frequency. In the circuit according to FIG. 1 the phase difference detector produces the phase difference information but it does not reveal the frequency difference. The VCO frequency settles at a certain relatively low speed.

Figure 3B:
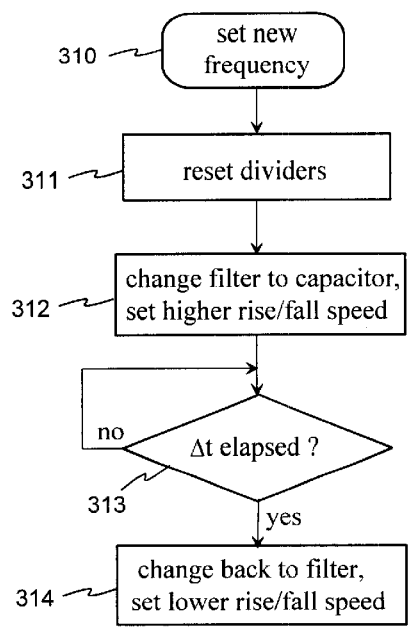

FIG. 3b shows an example of the second part of the method according to the invention. The operation starts from a situation 310 in which the PLL is given a new frequency setting. At the same time the r-divider and vco-divider are reset, step 311. In step 312, a change is made in the loop filter, which change is essential as regards the invention: The resistive part of the filter is bypassed so that only the capacitive part remains. Thereby the voltage of the circuit changes almost linearly when a constant current is fed into it or sunk from it. At the same time as the filter circuit is made purely capacitive, the speed of change of the voltage of the filter circuit is increased in order to speed up VCO control. This may be done by increasing the current value of the current sources in the charge pump in the circuit or by decreasing the total capacitance of the filter circuit. In step 313 time is counted. When a certain time Δt has elapsed, the filter circuit is restored into its normal mode and its speed of change of voltage is returned to the lower value. The time Δt corresponds to the VCO frequency settling time; it is e.g. two or three cycle times of the input signals of the phase difference detector.

The aim here is to correct the frequency difference for the most part during one cycle of the input signals of the phase difference detector. This is accomplished when $$I_2/C = \Delta f/(k_v \tau),$$

where $I_2$=current of charge pump current sources during frequency correction,

C=filter circuit capacitance, $\Delta f$=difference between the new and old frequency, $k_v$=VCO sensitivity (Hz/V), and $\tau$=length of the first pulse coming from phase difference detector after the frequency setting.

FIG. 4 shows an example of the implementation of the PLL according to the invention. The circuit is otherwise like the one in FIG. 1 except that it further comprises a divider reset unit 445 and filter switch SW with a control unit SWC. The reset unit 445 has got three D flip-flops and an AND gate. The clock input of the first flip-flop ff1 is connected to the output R of the r-divider 441, the D input is fixed to "1", and the output Q is connected to the reset input of the r-divider and to the first input of the AND gate. The clock input of the second flip-flop ff2 is connected to the output V of the v-divider 444, the D input is fixed to "1", and the output Q is connected to the reset inputs of the v-divider and prescaler 442 and to the second input of the AND gate. The output of the AND gate is connected to the D input of the third flip-flop ff3. The clock input of the flip-flop ff3 is connected to the output $CK_{ref}$ of the reference oscillator, and the output Q is connected to the reset input of the first and second flip-flop. Then, when the r-divider cycle is completed and the output R changes into "1", the first flip-flop sets the r-divider reset. Similarly, when the v-divider cycle is completed and the output V changes into "1", the second flip-flop sets the v-divider and prescaler resets. When both resets are on, the output of the third flip-flop is set to "1", resulting in the removal of the divider resets. So, the operation is in accordance with FIG. 3a. The logic of the reset unit 445 is naturally presented by way of example only.

In parallel with a resistor R1 the filter 420 has a switch component SW. The state of the switch component is determined by the output signal S of the switch control unit SWC. When new division factors a and n are loaded into the auxiliary divider 443 and v-divider 444, the signal S is at the same time set to "0", whereby the switch SW starts to conduct and the filter 420 becomes almost purely capacitive. In this example, signal S is further used to control the current sources J1, J2 in the charge pump 450. When S is "1", the source current I has a value $I_1$, and when S is "0", the source current I has a value $I_2$. Value $I_2$ is greater than value $I_1$ whereby the frequency of the VCO changes during the frequency correction more quickly than in the circuit according to FIG. 1. The change in the source current is brought about by changing, by means of switches, the structure of an individual current source J1, J2 or by connecting another current source in parallel with them. After the loading of the new division factors a and n, a count is started in the switch control unit SWC, and after a certain amount of cycles of the input signal V of the phase difference detector the control unit SWC returns to the normal state, making the switch SW non-conductive and setting the source current I to its lower value. The operation is thus in accordance with FIG. 3b. The generation of the control signal S, as described above, is naturally presented by way of example only. Signal S could be provided direct from an external processor, in which case the control unit SWC would not be required at all.

FIG. 5 shows a pulse diagram example of the operation of the circuit according to the invention. It shows from top down the variations in the following signals: r-divider output R, r-divider reset reset-r, v-divider output V, v-divider reset reset-v, and the second output U of the phase difference detector. The diagram starts at moment $t_0$ when an external processor issues a new frequency setting for the PLL. This results also in the resetting of the dividers so that the dividers simultaneously begin to count from zero. Before setting the frequency the loop was in lock and the cycle lengths $T_r$ and $T_v$ of the r-divider and v-divider were equal. In the example depicted, the VCO frequency is to be increased, whereby the division ratio pn+a becomes greater. From this it follows that after the frequency setting, when the VCO control has not yet been changed, the cycle length of the v-divider is greater than the r-divider's cycle length $T_r$ which remains constant. In FIG. 5 this greater cycle length of the v-divider is marked $T_{v1}$. After $T_r$, at moment $t_1$, the r-divider output signal R changes into "1", causing the r-divider to be reset according to the description of FIGS. 3a and 4. After a time $T_{v1}$ from the frequency setting, at moment $t_2$, the v-divider output signal V changes into "1", causing the v-divider and prescaler to be reset. The divider output signals R and V are at the same time input signals to the phase difference detector. Since the edge of the reference signal R appears before the edge of the second input signal V, a pulse is generated at the phase difference detector's output U. It starts from the leading edge of signal R and ends at the leading edge of signal V. The length $\tau_1$ of the first U pulse is thus the difference $T_{v1} - T_r$. When VCO frequency prior to the change=$f_i$ VCO frequency after the change=$f_j$ $f_j - f_i = \Delta f,$ then we get for the length of the U pulse, $\tau_1 = \Delta f/(f_i \cdot f_r).$ So the length $\tau_1$ of the pulse is proportional to the frequency change desired. Additionally, it depends on the VCO frequency prior to the frequency change. Therefore, the analog parts of the loop are chosen such that the control is at its most accurate at the center of the range of variation of the VCO frequency.

When the v-divider, too, has been reset, both dividers are released and they again start counting simultaneously from zero. After a time $T_r$, at moment $t_3$, the r-divider cycle is completed the second time and its output signal R changes into "1". After a time $T_{v2}$ from the ending of the second reset of the dividers, at moment $t_4$, the v-divider cycle is completed and its output signal V changes into "1". Before these cycles the VCO control voltage was linearly increased for the duration $\tau_1$ of the U pulse, which increased the VCO frequency. Therefore, time $T_{v2}$ is shorter than time $T_{v1}$. In the example of FIG. 5 the difference $T_{v2} - T_r = \tau_2$ is only a very small fraction of time $\tau_1$. This means that the difference between the dividers' output frequencies $f_r$ and $f_v$ has almost completely vanished. The frequency correction during pulse $\tau_2$ removes the frequency difference practically completely. In the ideal case the frequency difference vanishes already after the first pulse issued by the phase difference detector.

If the frequency setting involves decreasing the division ratio pn+a, the v-divider cycle will be completed before the r-divider cycle. In that case the phase difference detector will issue a D pulse proportional to the frequency difference, causing the VCO control voltage and frequency $f_{VCO}$ to drop.

FIG. 6 illustrates the settling of the VCO frequency in the PLL according to the invention and in a PLL according to the prior art. Time reference designators $t_0$ to $t_4$ correspond to the reference designators of FIG. 5. Plot 61 corresponds to the pulse diagram of FIG. 5. The VCO frequency at moment $t_0$ and from that moment on up till moment $t_1$ is $f_i$. From $t_1$ to $t_2$ the frequency $f_{VCO}$ increases near to its newly set value $f_j$. From $t_2$ to $t_3$ the frequency $f_{VCO}$ remains constant as the frequency error is being measured by means of the r-divider and vco-divider and phase difference detector. From $t_3$ to $t_4$ the frequency $f_{VCO}$ increases in this example slightly above its set value and at the next correction moment $t_5$ it settles with great accuracy to its set value $f_j$. After that the filter of the PLL according to the invention can be returned to its normal mode.

Plot 62 depicts the typical VCO frequency change in a prior-art PLL. The frequency approaches its set value relatively slowly, due to the loop characteristics chosen according to the noise and stability requirements. The frequency change continues after the set value has been reached, and then approaches it again, this time from above. Final settling takes place only after several oscillations.

Plot 61, as compared to plot 62, illustrates the advantage of the invention, when applied to an ordinary frequency synthesizer implemented using a PLL. A prior-art circuit according to FIG. 2 may achieve similar results as the present invention. However, it should be noted that the implementation of the circuit shown in FIG. 2 differs from the present invention: In the former, the cut-off frequency of the loop filter is increased by means of a switch in order to speed up the filter. In the present invention, the filter is turned into a capacitive circuit so that the VCO control voltage changes linearly and in direct proportion to the frequency difference during a control pulse. In addition, a relatively large additional logic (FDMSC) is used in the circuit of FIG. 2 to observe when the VCO frequency will have reached its set value. For the whole duration of this observation period the filter control is set. In the present invention, the frequency difference is measured immediately after the new frequency setting by means of logic that is already included in the structure for the most part, and a control pulse corresponding to the measurement result is then issued to the VCO.

Above it was described the principle of the invention and a circuit according to it. The invention is not limited to that circuit only. The basic structure of the PLL may vary in many aspects. Furthermore, the operation according to the invention may be realized using different circuit solutions. The inventional idea may be applied in many different ways within the scope defined by the independent claims.

What is claimed is:

1. A method for setting a frequency in a phase locked loop having, in that order, a reference divider to decrease a reference frequency, phase difference detector, a charge pump, a filter, a voltage-controlled oscillator, and a programmable VCO-divider to decrease the frequency produced by the voltage-controlled oscillator, which method comprises the steps of:
   comparing phases of the signals output by the reference divider and VCO-divider,
   processing signals produced by said comparison and controlling said oscillator with a control voltage produced by the processing mentioned above, and
   resetting the reference divider and VCO-divider after a new frequency setting has been made in the programmable VCO-divider, wherein after the new frequency setting has been made, the following actions are taken at least during a first cycle of the reference divider:
   forming a pulse, a length of which is proportional to a difference between the new frequency setting and an actual frequency output by the voltage controlled oscillator, and
   changing the control voltage of the voltage-controlled oscillator proportionally to the length of said pulse, by an amount corresponding substantially to said frequency difference.

2. A method according to claim 1, wherein in order to form said pulse,
   the reference divider reset is set when the state of its output signal has changed as the cycle of the reference divider is completed,
   the VCO-divider reset is set when the state of its output signal has changed as the cycle of the VCO-divider is completed,
   a time interval is observed between the moment that the cycle of the reference divider is completed and that moment that the cycle of the VCO-divider is completed, and
   said resets are removed when both the reference divider and the VCO-divider are in the reset state, to start forming the next pulse.

3. A method according to claim 1, wherein in order to change the control voltage of the voltage-controlled oscillator proportionally to the length of said pulse, said filter is turned into a purely capacitive circuit the voltage of which changes substantially linearly when a direct current flows into or out of the circuit.

4. A method according to claim 1, wherein in order to change the control voltage of the voltage-controlled oscillator by an amount corresponding substantially to said frequency difference, the speed of change of the voltage of said purely capacitive circuit is increased.

5. A method according to claim 4, wherein in order to increase the speed of change of the voltage, a current of current sources in said charge pump is increased.

6. An arrangement for setting a frequency in a phase locked loop having, in that order, a reference divider to decrease a reference frequency, a phase difference detector, a charge pump, a filter, a voltage-controlled oscillator, a programmable VCO-divider to decrease a frequency produced by the voltage controlled oscillator, and means for resetting the reference divider and the VCO-divider after a new frequency setting has been made in the programmable VCO-divider, the arrangement further comprising:
   means for forming, during a single cycle of the reference divider, a pulse, a length of which is proportional to a difference between the new frequency setting and an actual frequency output by the voltage controlled oscillator and, means for changing a control voltage of the voltage-controlled oscillator proportionally to the length of said pulse, by an amount substantially corresponding to said frequency difference.

7. An arrangement according to claim 6, wherein said means for forming said pulse comprises said reference divider, the programmable VCO-divider and phase difference detector, and additionally a reset unit for the reference divider and the programmable VCO-divider.

8. An arrangement according to claim 7, wherein said reset unit for the reference divider and VCO-divider comprises a first flip-flop for setting a reset for the reference divider when a state of an output signal of the reference divider has changed as its cycle is completed, a second flip-flop for setting a reset for the VCO-divider when a state of an output signal of the VCO-divider has changed as its cycle is completed, and a circuit for removing said settings of the first flip-flop and the second flip-flop when both the reference divider and the VCO-divider are in a reset state.

9. An arrangement according to claim 6, wherein said means for changing the control voltage of the voltage-controlled oscillator proportionally to the length of said pulse comprises, in parallel with a resistive part of the filter, a first switch, which turns said filter into a substantially purely capacitive circuit, and said means for changing the control voltage of the voltage-controlled oscillator by an amount substantially corresponding to said frequency difference further comprises switches for changing source currents in said charge pump.

10. An arrangement according to claim 9, whereby said means for changing the control voltage of the voltage-controlled oscillator proportionally to the length of said pulse by the amount substantially corresponding to said frequency difference further comprises control means for a first switch and said switches, said control means being arranged so as to close said first switch and to make said source currents larger after a new frequency setting has been made, and to open said first switch and make said source currents smaller again after a certain period of time from the new frequency setting.

11. An arrangement according to claim 10, wherein said control means for said first switch and said switches comprises a logic unit.

12. An arrangement according to claim 10, wherein said control means for said first switch and said switches comprises a program in a processor outside the phase-locked loop.

* * * * *